United States Patent
Platzgummer

(10) Patent No.: US 8,115,183 B2
(45) Date of Patent: Feb. 14, 2012

(54) METHOD FOR MASKLESS PARTICLE-BEAM EXPOSURE

(75) Inventor: Elmar Platzgummer, Vienna (AT)

(73) Assignee: IMS Nanofabrication AG, Vienna (AT)

( * ) Notice: Subject to any disclaimer, the term of this patent is extended or adjusted under 35 U.S.C. 154(b) by 154 days.

(21) Appl. No.: 12/770,904

(22) Filed: Apr. 30, 2010

(65) Prior Publication Data

US 2010/0252733 A1 Oct. 7, 2010

Related U.S. Application Data

(62) Division of application No. 12/051,087, filed on Mar. 19, 2008, now Pat. No. 7,777,201.

(30) Foreign Application Priority Data

Mar. 29, 2007 (AT) .................................. A496/2007

(51) Int. Cl.
*G21K 5/10* (2006.01)
(52) U.S. Cl. ...................... 250/492.2; 250/397; 250/398; 250/491.1; 250/492.1; 250/492.22
(58) Field of Classification Search .................. 250/397, 250/398, 491.1, 492.1, 492.2, 492.22
See application file for complete search history.

(56) References Cited

U.S. PATENT DOCUMENTS

| 3,875,414 | A | * | 4/1975 | Prior | 250/492.1 |
|---|---|---|---|---|---|
| 4,123,661 | A | * | 10/1978 | Wolf et al. | 250/492.1 |
| 4,199,689 | A | * | 4/1980 | Takigawa | 250/492.2 |
| 4,385,238 | A | * | 5/1983 | Westerberg et al. | 250/491.1 |
| 4,413,186 | A | * | 11/1983 | Uema | 250/491.1 |
| 4,528,452 | A | * | 7/1985 | Livesay | 250/491.1 |
| 4,785,187 | A | * | 11/1988 | Kariya et al. | 250/491.1 |
| 4,967,088 | A | * | 10/1990 | Stengl et al. | 250/491.1 |
| 4,985,634 | A | * | 1/1991 | Stengl et al. | 250/492.2 |
| 5,012,105 | A | * | 4/1991 | Ando et al. | 250/398 |
| 5,578,821 | A | * | 11/1996 | Meisberger et al. | 250/310 |
| 5,841,145 | A | | 11/1998 | Satoh et al. | |
| 5,906,902 | A | * | 5/1999 | Farrow | 430/30 |

(Continued)

FOREIGN PATENT DOCUMENTS

WO   WO 2006/048391 A1   5/2006

(Continued)

OTHER PUBLICATIONS

Berry et al., "Programmable aperture plate for maskless high-throughput nanolithography," J. Vac. Sci. Technol. B 15(6), Nov./Dec. 1997, pp. 2382-2386.

*Primary Examiner* — David A Vanore
(74) *Attorney, Agent, or Firm* — RatnerPrestia

(57) ABSTRACT

For maskless irradiating a target with a beam of energetic electrically charged particles using a pattern definition means with a plurality of apertures and imaging the apertures in the pattern definition means onto a target which moves (v) relative to the pattern definition means laterally to the axis, the location of the image is moved along with the target, for a pixel exposure period within which a distance of relative movement of the target is covered which is at least a multiple of the width (w) of the aperture images as measured on the target, and after said pixel exposure period the location of the beam image is changed, which change of location generally compensates the overall movement of the location of the beam image.

7 Claims, 12 Drawing Sheets

U.S. PATENT DOCUMENTS

| | | | |
|---|---|---|---|
| 5,929,454 A | 7/1999 | Muraki et al. | |
| 5,977,548 A * | 11/1999 | Oae et al. | 250/397 |
| 6,037,601 A * | 3/2000 | Okunuki | 250/492.23 |
| 6,617,587 B2 * | 9/2003 | Parker et al. | 250/398 |
| 6,660,105 B1 * | 12/2003 | Ochi et al. | 148/320 |
| 6,768,125 B2 * | 7/2004 | Platzgummer et al. | 250/492.22 |
| 6,835,937 B1 | 12/2004 | Muraki et al. | |
| 6,844,550 B1 * | 1/2005 | Yin et al. | 850/9 |
| 6,872,953 B1 * | 3/2005 | Benveniste | 250/397 |
| 6,977,375 B2 * | 12/2005 | Yin et al. | 850/6 |
| 6,989,546 B2 * | 1/2006 | Loschner et al. | 250/492.22 |
| 7,214,951 B2 * | 5/2007 | Stengl et al. | 250/492.23 |
| 7,244,932 B2 * | 7/2007 | Nakasuji et al. | 250/306 |
| 7,456,491 B2 * | 11/2008 | Pilla | 257/653 |
| 7,598,499 B2 * | 10/2009 | Platzgummer | 250/398 |
| 7,772,574 B2 * | 8/2010 | Stengl et al. | 250/492.22 |
| 2002/0033457 A1 * | 3/2002 | Chalupka et al. | 250/491.1 |
| 2003/0085360 A1 * | 5/2003 | Parker et al. | 250/396 R |
| 2005/0104013 A1 * | 5/2005 | Stengl et al. | 250/492.21 |
| 2005/0242303 A1 | 11/2005 | Platzgummer | |
| 2006/0102853 A1 | 5/2006 | Heinitz et al. | |
| 2008/0099693 A1 * | 5/2008 | Platzgummer | 250/398 |
| 2008/0149846 A1 * | 6/2008 | Platzgummer | 250/398 |
| 2008/0210887 A1 * | 9/2008 | Buschbeck et al. | 250/492.2 |
| 2008/0230711 A1 * | 9/2008 | Platzgummer et al. | 250/396 R |
| 2008/0237460 A1 * | 10/2008 | Fragner et al. | 250/307 |
| 2008/0258084 A1 * | 10/2008 | Platzgummer et al. | 250/492.21 |
| 2008/0283767 A1 * | 11/2008 | Platzgummer | 250/396 R |
| 2009/0026389 A1 * | 1/2009 | Platzgummer | 250/492.2 |
| 2009/0146082 A1 * | 6/2009 | Stengl et al. | 250/492.22 |
| 2009/0200495 A1 * | 8/2009 | Platzgummer | 250/492.22 |

FOREIGN PATENT DOCUMENTS

| | | |
|---|---|---|
| WO | WO 2006/053358 A1 | 5/2006 |
| WO | WO 2007/112465 A1 | 10/2007 |

* cited by examiner

METHOD FOR MASKLESS PARTICLE-BEAM EXPOSURE

CROSS REFERENCE TO RELATED APPLICATIONS

This application is a U.S. Divisional application of U.S. patent application Ser. No. 12/051,087, filed Mar. 19, 2008. The contents of this application are incorporated herein by reference.

FIELD OF THE INVENTION AND DESCRIPTION OF PRIOR ART

The invention relates to an improved method for irradiating a target with a beam of energetic electrically charged particles, wherein a pattern definition means having a plurality of apertures transparent to said particles is used, and by illuminating said pattern definition means with said beam, which traverses the pattern definition means through said apertures, a patterned beam is formed consisting of a corresponding plurality of beamlets, and said patterned beam is formed into an image on the location of the target, said image comprising the images of at least part of the plurality of apertures; the aperture images have a first width, wherein said target moves relative to the pattern definition means along a path within an image plane in which the images of apertures are formed (or in a direction generally perpendicular to a propagation direction of the patterned beam).

A method of this kind and the pertinent particle-beam apparatus is disclosed in the U.S. Pat. No. 6,768,125, which is hereby incorporated into the present disclosure as relevant prior art. That patent describes a charged-particle lithography and processing method and apparatus dubbed PML2 (short for "Projection Mask-Less Lithography") which realizes a multi-beam direct write concept and uses a programmable aperture plate system (APS) as a pattern definition (PD) device for structuring a particle beam, which is extracted from a single source of electrically charged particles.

Particle lithography and processing is used in semiconductor production and micro-structuring applications. In particular direct patterning by ion-beam irradiation is a promising concept for the future industrial fabrication of nano-scale devices with high resolutions, in multi-aperture device. The implementation of a multi-beam projection optical system based on a programmable multi-aperture plate allows a significant improvement of the achievable productivity in comparison with focused single beam systems. (In this disclosure 'optical' always is meant as 'particle-optical'.) The reasons for the improved productivity are, firstly, the parallelism of the process using a plurality of beams and, secondly, the increased current which can be imaged to a substrate at the same resolution. Both are made possible by a significantly reduced Coulomb interaction in the beam. Furthermore, the moderate current density related to the projection optical system results in an enhanced process rate when precursor gases are used for beam-induced chemical processes. As compared with a focused beam system, also the reduced heating effect due to extreme beam intensity can be reduced or avoided.

In the PML2 layout as disclosed in the U.S. Pat. No. 6,768,125 and related prior art the position of the patterned beam on the target is held fixed on the corresponding pixel positions only for the duration one pixel of the target takes to travel under the optical system. Then the patterned beam jumps to the position of the next pixel which is adjacent to the previous one. In this manner, each beamlet covers adjacent pixels on the target. This strategy requires a rapid loading rate of the pattern information, which may cause an upper limit for the processing speed of the method.

The diagram of FIG. 19 illustrates this prior-art writing strategy, for the example of one line of pixels to be exposed on a target such as a resist-covered semiconductor wafer. The pixels of this one line are irradiated (exposed) by a number of beamlets (respectively denoted by capital letters A, B, C, ... ), and each beamlet irradiates a sequence of adjacent pixels during successive time steps. The amount of exposure dose imparted to each pixel is symbolized by hatched and cross-hatched fields. The cross-hatched fields denote pixels that are completely illuminated (according to a programmed pattern; subsequent exposures are depicted symbolically stacked on top of each other while in reality they simply add up), whereas simply hatched fields indicate pixels in the course of exposure. The dose for every pixel is successively summed up while the resist moves below the PD device forming the beamlets (see the discussion of maskless multi-beam writing discussed below in relation to FIG. 1). Each beamlet has the same time interval in which it contributes a partial exposure dose to the substrate, and consequently contributes the same amount of dose. Every beamlet in a line is used to expose every pixel in that line. In order to switch on and off the beamlets through the apertures in the PD device in accordance with this exposure method, the PD device apertures require the pattern information at a corresponding data rate, and the image information has to be distributed to every single aperture on the APS.

The first two frames of FIG. 19 depict the situation at the beginning and the end of one time interval for the exposure of one pixel (per beamlet), denoted t=0:0 and 0:1, respectively. It is clear from the depiction that the beamlets are moved along with the target so their positions are locked on the (moving) position of the pixels during the pixel exposure. When the exposure of the pixel is finished after t=0:1, all beamlet are repositioned so as to lock on the position of the next pixels, respectively; the third frame t=1:0 shows the beginning of the next pixel exposure. The repositioning of the beamlets occurs in a very short time, much shorter than the complete time lag Tw between consecutive pixel exposures. (Tw is equal to the time between frames 0:0 and 1:0.) The mutual distance of beamlets is 5w, i.e., five times the width of the beamlets; but with the prior-art method other integer values are equally well suitable as discussed in the U.S. Pat. No. 6,768,125.

The diagram of FIG. 20 illustrates the timing of the prior art writing process of FIG. 19. At the top the beam deflection x is shown as a function of time t; the beam deflection describes a sawtooth-like function over time. The transient oscillations until the deflection is stable after each repositioning are also shown. Below the beam deflection x the exemplary states $p_A$, ..., $p_E$ of five apertures of the APS (as examples out of a large number of apertures, typically many thousands) are shown. Each beamlet A to E will be projected onto the target only when the respective state $p_A$ to $p_E$ is low (non-energized, beamlet switched on) as further explained below with reference to FIG. 1. It can be seen that during each pixel exposure proper the states of the apertures are unchanged. It follows that during one period of the sawtooth function only a one-bit information per aperture can be processed.

The prior-art approach makes it difficult to find a suitable on-chip data storage layout that is efficient and can handle the required data rates. Currently the use of shift registers is the most promising solution for this problem (see US 2005/0242303 A1).

SUMMARY OF THE INVENTION

The present invention provides a method which offers high throughput rates in combination with a PD design that is easy to implement to overcome the deficiencies of the prior art.

The invention is directed to a target irradiating method as set out at the beginning, wherein during pixel exposure periods the location of the beam image is moved along with the target, with the pixel exposure periods having a duration within which the relative movement of the target covers a distance, the distance of advance, which is greater than said first width as measured on the target, preferably at least a multiple of the first width (i.e., at least 2.0 times and more preferably 3 times the first width or more); and after the pixel exposure periods the location of said beam image is changed (repositioned on the target), so as to generally compensate the movement of the location of the beam image during the pixel exposure periods with regard to the location of the PD means.

The invention offers a writing strategy that offers an optimal writing speed over the target and lends itself to an electronic layout which is realizable using standard CMOS technologies and allows a simplified realization of the blanking circuitry in the PD means.

The invention provides a PD device for electron beam writing which makes it possible to write with the speed only limited by the e-beam density and the APS transitivity. Power consumption and data rate to the APS can be handled within the UMC 0.25 µm process. Currently used architectures would fail in these two aspects by many orders of magnitude.

In order to ensure that the beamlets expose the complete surface of the target, the number of beamlets that expose different pixels will be chosen such that the first width multiplied with the number of said beamlets is equal to (or even greater than) said distance of advance. In the usual case that there are groups of redundant beamlets (viz., the beamlets which are in a same line as measured along the direction of the relative movement of the target form groups, 'redundancy groups', within which the beamlets have a distance from each other which, when measured on the target, is an integer multiple of said distance of advance) the number of these redundancy groups is chosen such that the first width multiplied with the number of said groups is equal to or greater than said distance of advance.

In a preferred embodiment of the invention, the relative movement of the target is a continuous linear movement for durations comprising multiple pixel exposure periods. Usually, it is the target which is moved while the PD device and the optical system are kept fixed. The target movement may preferably be a scanning motion along scanning sweeps in a primary direction.

Furthermore it is advantageous if outside of said pixel exposure periods the patterned beam is blanked out in a manner that it does not reach the target, but is absorbed at an absorbing means before it can reach the target.

In a suitable choice of the relative movement of the target, the distance made during periods of time between the starts of consecutive first intervals amounts to a second width being an integer multiple of said first width. In this case, the separation distances of two beamlets which are in a same line as measured along the direction of the relative movement of the target may be integer multiples of said first width, and at least some of said integer multiples may be chosen so as to be relatively prime to the integer multiple of said second width. One simple way for this is that said integer multiples differ by one unit.

In a preferred embodiment the pattern definition means comprises a plurality of electrostatic beamlet deflectors, each of which is associated with a respective aperture of the pattern definition means and is adapted to deflect the beamlet traversing the respective aperture by an amount dependent on an individual control signal, including an amount sufficient to deflect the beamlet off its nominal path (thus effectively switching off that beamlet so it does not reach the target). In this case, the apertures of the pattern definition means are controlled in a time-dependent manner according to a pattern to be formed on the target by means of a plurality of said control signals.

In this preferred embodiment, preferably, the apertures are logically grouped into disjoint groups, and the control signals of the apertures of each group are applied through a common control line in a time-staggered manner. Suitably, the apertures of each group may be arranged in the pattern definition means along a direction of orientation generally perpendicular to the direction of relative movement of the target. The apertures of each group may then extend over one half of a breadth of an area covered by the apertures of the pattern definition means, as measured along the direction of orientation of generally (but not necessarily) perpendicular to the direction of relative movement of the target, with the control signals being fed to said area of apertures from two opposite sides.

Also in this preferred embodiment, the pattern definition means may comprise data storage means, where data for activating the control signals are fed to and stored in; allowing that said data are individually read out to accordingly activate the control signals. The data storage means may be double-ported, wherein during each pixel exposure period data for controlling the apertures are read out to the control signals through a first port of said storage means, and data concerning the consecutive pixel exposure period is stored through a second port of said storage means.

Another profitable development of this preferred embodiment is to group the apertures of the pattern definition means into groups of mutually redundant apertures, wherein for each group the control signals associated with the apertures of the group are generated from a common signal which is copied to the control signals in turn. In this case, the common signal may be copied to the control signals with respective time delays in correspondence with the spatial offset of the respective apertures along the direction of relative movement of the target. In order to realize gray levels (see US 2005/0242303 A1) the common signal of a group may include information of a gray value to be realized through the apertures belonging to the group, and then the gray value is expanded into a sequence of non-active and active control signals in accordance with the gray value which defines the relative number of non-active control signals over the total number of control signals in the group. Expanding of the gray value may be performed before or after reading out the data from the storing means, and the expanding method may advantageously comprise at least one of the following methods: expansion into an evenly-spaced sequence, expansion into a pseudo-random sequence, expansion using linear feedback shift registers, expansion using different offsets for the individual control signal bits; or a combination thereof.

Of course, the invention can also be combined with other known writing strategies, such as an additional global blanking signal which asynchronously masks the blanker flip flop outputs (see WO 2007/112465).

Furthermore, the plate realizing the array of apertures may be doubled and operated in parallel so that the apertures are arranged in (at least) two parallel arrays, displaced to each other by a distance along the beam.

Another aspect of the invention relates to positioning a target using a beam of energetic electrically charged particles, in particular in conjunction with a target irradiating method as discussed here, wherein during the positioning method the target is moved relative to the pattern definition means along a path within an image plane in which the images of apertures are formed, wherein the relative movement of the target covers a distance of advance greater than the first width as measured on the target, while at least part of the beam impinges on markers provided on the target which then produce secondary radiation, and the secondary radiation is detected by a detection system with a suitably high sampling rate, so as to adjust the position of the target in a manner that the secondary radiation as measured obtains an extremal (maximum or minimum) value.

With this method, preferably, the substrate stage moves the target at a continuous speed equaling a speed at which the target is moving during a subsequent exposure process according to the irradiation method described above.

One suitable realization of the markers comprises structures which are part of a multi-layer structure, and these structures have been formed on the target in at least one foregoing process step. In particular, the markers may comprise components adapted to produce secondary radiation comprising characteristic Auger electron radiation, and the detection system employ an energy selective detector adapted to detect said Auger radiation. In another realization the markers may comprise components having a characteristic backscattering yield.

A particular advantage is that the target positioning method and a subsequent particle-beam exposure exposure/irradiation process performed on the target can employ the same pattern definition means with the target moving relatively to the pattern definition means in a corresponding manner. However, the distance of advance of the target positioning method may be larger than that during the particle-beam exposure/irradiation process.

BRIEF DESCRIPTION OF THE DRAWINGS

In the following, the present invention is described in more detail with reference to the drawings, which show:

FIG. 15a shows a variant using buried markers.

DETAILED DESCRIPTION OF THE INVENTION

The preferred embodiment of the invention discussed in the following is a development from the PML2-type particle-beam exposure apparatus with a pattern definition (PD) system as disclosed in the U.S. Pat. No. 6,768,125 (=GB 2 389 454 A) of the assignee/applicant, and with a large-reduction projecting system. In the following, first the technical background of the apparatus is rendered as far as relevant to the invention, then embodiments of the invention are discussed in detail. It should be appreciated that the invention is not restricted to the following embodiments or the particular layout of PD system, which merely represent one of the possible implementations of the invention; rather, the invention is suitable for other types of processing systems that employ a particle-beam with projection stages as well.

PML2 System

Figure 1:
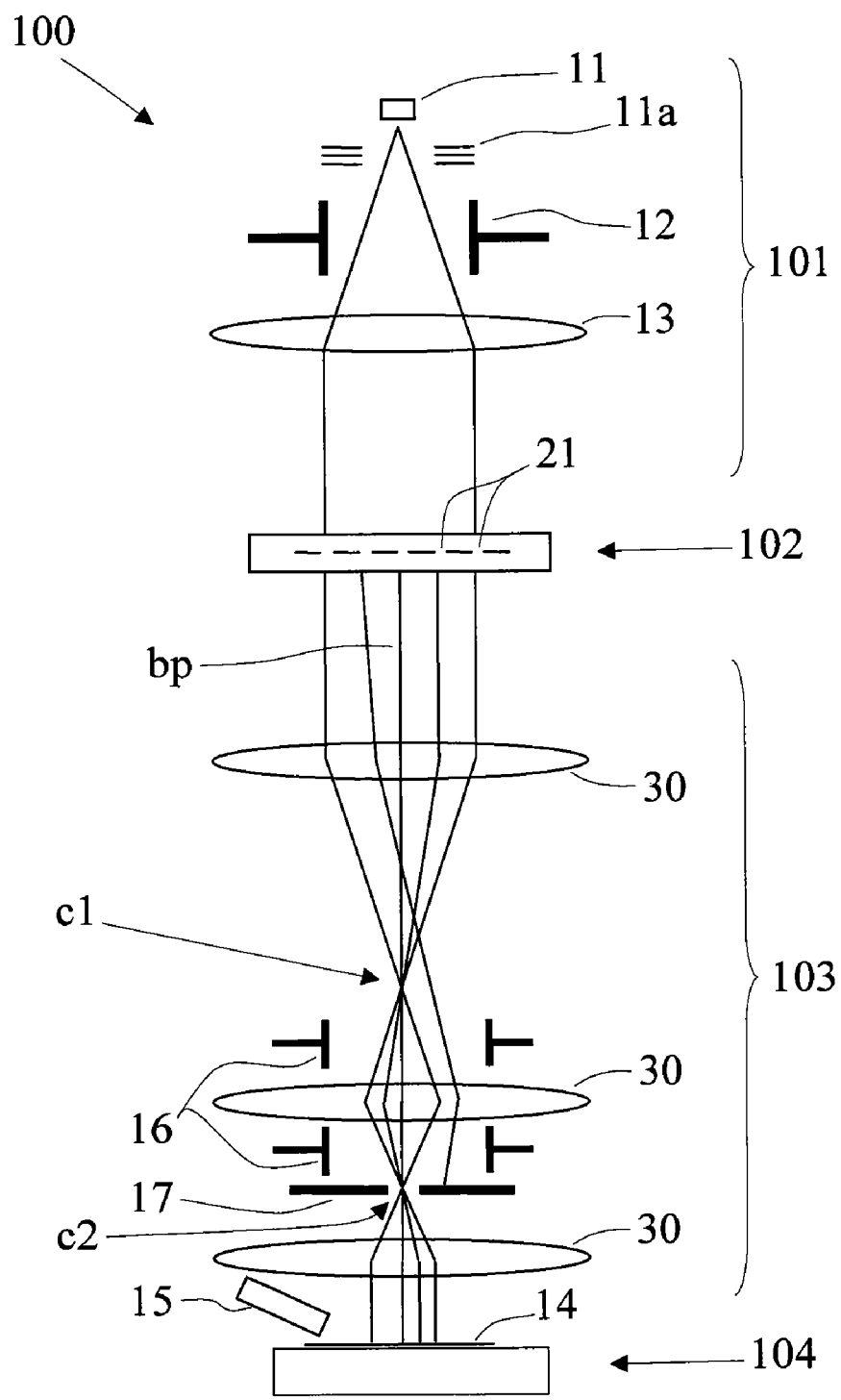
FIG. 1 shows a schematic overview of a particle-beam exposure apparatus suitable for the invention in a longitudinal section.

A schematic overview of a maskless particle-beam processing apparatus PML2 employing the invention is shown in FIG. 1. In the following, only those details are given as needed to disclose the invention; for the sake of clarity, the components are not shown to size in FIG. 1, particularly the lateral width of the particle beam is exaggerated. For more details, the reader is referred to the U.S. Pat. No. 6,768,125.

As already mentioned, a particle beam generated by a particle source is used in the PML2 system. An illumination optical system forms the beam into a wide beam which illuminates a PD means having a regular array of apertures in order to define a beam pattern to be projected on a target surface. With each aperture, a small beam is defined, and the passage of each beam through an aperture can be controlled so as to allow ('switch on') or effectively deactivate ('switch off') the passage of particles of the beam through the respective apertures towards the target. The beam permeating the aperture array forms a patterned particle beam bearing pattern information as represented by the spatial arrangement of the apertures. The patterned beam is then projected by means of a particle-optical projection system onto the target (for instance, a semiconductor substrate) where an image of the apertures is thus formed to modify the target at the irradiated portions. The image formed by the beam is moved along a straight path over each die field; additional scanning of the beam in a direction perpendicular to the scanning direction is not necessary (except, where needed, to compensate for lateral travel motion errors of the target stage).

The main components of the apparatus 100 are—in the order of the direction of the lithography beam lb, pb which in this example runs vertically downward in FIG. 1—an illumination system 101, a PD system 102, a projecting system 103, and a target station 104 with the target or substrate 14. The particle-optical systems 101, 103 are realized using electrostatic or electromagnetic lenses. The electro-optical parts 101,102,103 of the apparatus 100 are contained in a vacuum housing (not shown) held at high vacuum to ensure an unimpeded propagation of the beam lb, pb along the optical axis of the apparatus.

The illumination system 101 comprises, for instance, an ion source 11, an extractor arrangement 11a defining the location of the virtual source, a particle filter/general blanker 12 and an illumination optics realized by a condenser lens system 13. The ions used can be, for instance, hydrogen ions or heavy ions; in the context of this disclosure heavy ions refer to ions of elements heavier than C, such as O, N, or the noble gases Ne, Ar, Kr, Xe. Apart from ions, the particles can be electrons (emitted from an electron gun) or, in general, other electrically charged particles can be used as well.

The ion source 11 emits energetic ions of primarily a certain species, such as $Ar^+$ ions having a defined (kinetic) energy of typically several keV (e.g. 5 keV at the PD system 102) with a comparatively small energy spread of, e.g., $\Delta E=1$ eV; however, it is generally unavoidable that the source emits charged particles of other species as well. A velocity/energy dependent filter 12 serves to filter out such unwanted particle species; this device may also be used to blank out the beam as a whole during repositioning of the beamlets. By means of an electrooptical condenser lens system 13, the ions emitted from the source 11 are formed into a wide-area, substantially telecentric ion beam serving as lithography beam lb. The telecentricity of the beam is within a range of ±25 μrad deviation from the optical axis at the position of the PD device, resulting in a telecentricity range of ±5 mrad deviation from the optical axis at the position of the substrate, assuming here a 200× reduction system and equal particle energies at PD device and substrate.

The lithography beam lb then irradiates a PD device which, together with the devices needed to keep its position, forms the PD system 102. The PD device is held at a specific position in the path of the lithography beam lb, which thus irradiates an aperture pattern formed by a plurality of apertures 21. As already mentioned, each of the apertures can be "switched on" or "open" so as to allow the beamlet passing through the respective aperture to reach the target; it is then said, the aperture is transparent to the incident beam. Otherwise, the aperture is "switched off" or "closed", in which case the beam path of the respective beamlet is affected in a way that it will be absorbed or otherwise removed out of the beam path before it can reach the target; thus, the aperture is effectively non-transparent or opaque to the beam. The pattern of switched-on apertures is chosen according to the pattern to be exposed on the substrate, as these apertures are the only portions of the PD device transparent to the beam lb, which is thus formed into a patterned beam pb emerging from the apertures (i.e., in FIG. 1, below the PD system 102). The architecture and operation of the PD device, in particular with regard to its blanking plate, is discussed in detail below. In FIG. 1 only five beamlets (out of a large number) are shown in the patterned beam pb, of which the second beamlet from the left is switched off as it is absorbed on an absorbing plate 17; the other, switched-on beamlets pass through a central opening of the plate 17 and thus are projected onto the target.

The pattern as represented by the patterned beam pb is then projected by means of an electro-optical projection system 103 onto the substrate 14 where it forms an image of the switched-on mask apertures. The projection system 103 implements a demagnification of, for instance, 200×. The substrate 14 is, for instance, a silicon wafer covered with a photo-resist layer. The wafer 14 is held and positioned by a wafer stage (not shown) of the target station 104. A detector 15 for secondary radiation can be used to detect the proper positioning of the substrate with respect to the beam; this is further discussed below ('Marker Reading').

The projection system 103 is preferably composed of two consecutive electro-optical projector stages with a crossover c1, c2, respectively. The electrostatic lenses 30 used to realize the projectors are shown in FIG. 1 in symbolic form only as technical realizations of electrostatic imaging systems are well known in the prior art. The first projector stage images the plane of the apertures of the PD device to an intermediate image which in turn is imaged onto the substrate surface by means of the second projector stage. Both stages employ a demagnifying imaging through crossovers c1,c2; thus, while the intermediate image is inverted, the final image produced on the substrate is upright (non-inverted). The demagnification factor is about 14× for both stages, resulting in an overall demagnification of 200×. A demagnification of this order is in particular suitable with a lithography setup, in order to alleviate problems of miniaturization in the PD device. The electrooptical lenses are mainly composed of electrostatic electrodes, but magnetic lenses may also be used.

As a means to introduce a small lateral shift to the image, i.e. along a direction perpendicular to the optical axis cx, deflection means 16 are provided in one or both of the projector stages. Such deflection means can be realized as, for instance, a multipole electrode system, as discussed in the U.S. Pat. No. 6,768,125. Additionally, a magnetic coil may be used to generate a rotation of the pattern in the substrate plane where needed. The lateral deflections are quite small in comparison to the lateral width of the patterned beam by itself. Even though the lateral deflections that are required with the invention are a multiple of the width of a single beamlet, that distance will still be at least one order of magnitudes below the beam width since the lateral dimension of one beamlet is considerably smaller than that of the beam by seen as a whole.

By controlling the pattern formed in the PD system 102, an arbitrary beam pattern can be generated and transferred to a substrate. Suitably, a scanning stripe exposure strategy, where the substrate is moved under the incident beam, is utilized so a beam-scanning strategy is not required, where the position of the beam is perpetually changed and thus the beam is effectively scanned over the (more or less resting) target surface like in case of a single focused beam system.

Figure 17:
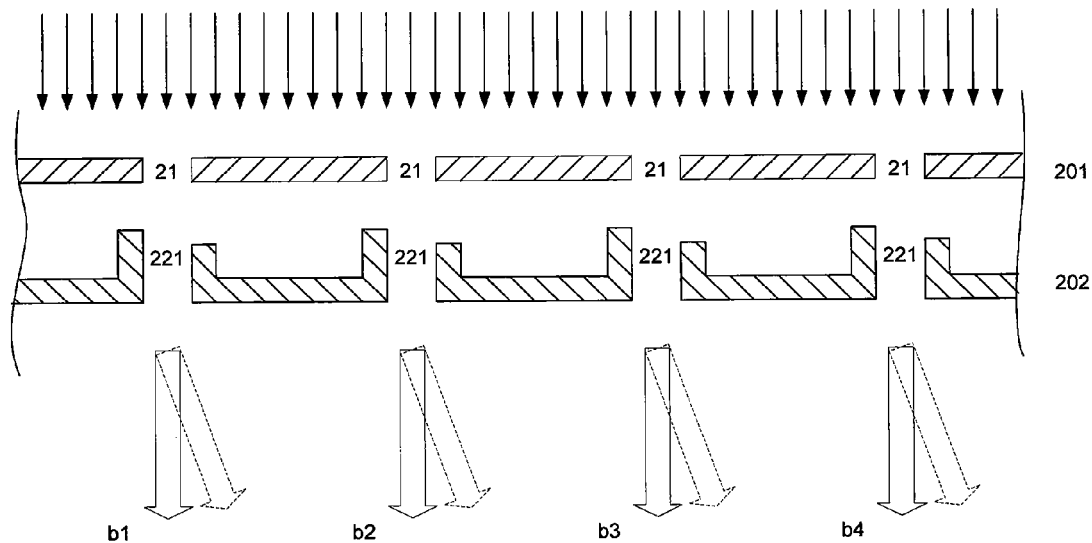
FIG. 17 shows a PD device (longitudinal sectional detail) according to prior art, but which may be used in the apparatus of FIG. 1 as well.

FIG. 17 shows a longitudinal section detail of one possible realization of the PD system 102 in a two-plate arrangement. The layout shown is known from prior art but is suitable to use with the invention nonetheless. A first plate 201 is an aperture plate having a set of apertures 21; only three out of a large number of apertures are shown. The plate 201, through its apertures 21, defines a corresponding number of beamlets b1, b2, b3. The apertures 21 are imaged to the target as mentioned earlier. The apertures 21 are arranged in a systematic manner forming staggered lines running parallel to a direction which corresponds to the relative movement of the images of the apertures over the target as described in the U.S. Pat. No. 6,768,125. In each line the offset between consecutive apertures is preferably a multiple of the width of the aperture, while the lines run immediately side by side such that the aperture images completely cover the target in the course of the scanning movement over the target.

The second plate 202 of the PD system 102 is called blanking plate. It has a set of openings whose positions correspond to those of the apertures 21 in the aperture plate 201, but whose widths are greater so the beamlets pass through them without affecting the blanking plate material. The openings in the blanking plate 202 are provided with electrodes 221 so as to impart a small but sufficient deflection to the corresponding beamlet. Each beamlet can be deflected individually as explained in detail below. The blanking plate also comprises the circuitry for electronic controlling and electric supply of the electrodes. Further basic details of a PD device are discussed in the U.S. Pat. No. 6,768,125 and related prior art, whereas a preferred layout of the blanking plate circuitry according to the invention is discussed below.

Figure 18:
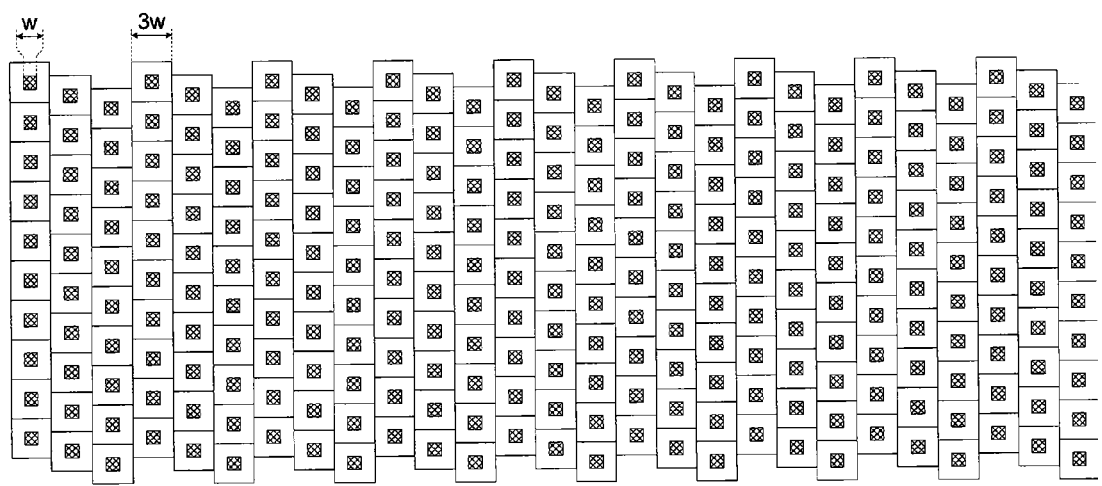
FIG. 18 shows a plan view with the geometric layout of apertures in a prior-art PD device.
Figure 19:
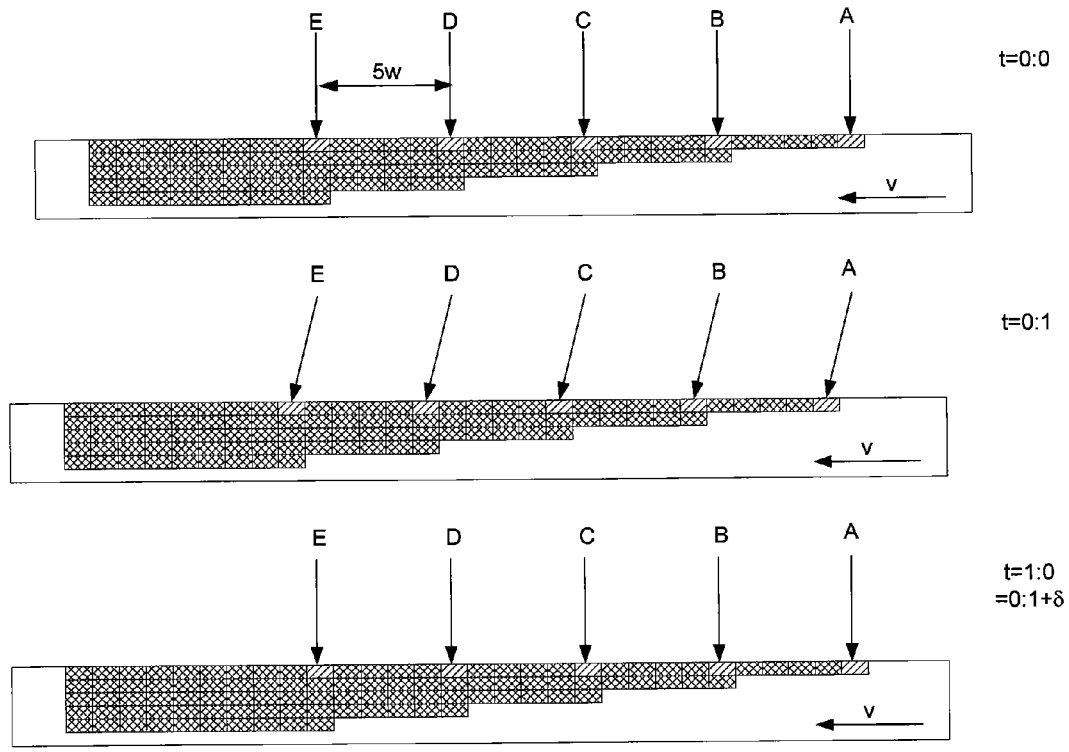
FIGS. 19 and 20 illustrate the prior-art writing strategy in contrast to analogous FIGS. 2 and 3, respectively.

FIG. 18 illustrates the plan view arrangement of apertures on the PD device typical in prior art. The apertures are represented as cross-hatched squares, the orientation is chosen such that the horizontal direction coincides with the direction of (relative) substrate movement during exposure (cf. FIG. 19). Along this direction, the apertures are evenly spaced in rows, and between adjacent rows the apertures are offset, so as to realize a staggered arrangement, with the offset being an integer multiple of the aperture width w. In the example shown the offset is 3w, and the pattern of apertures repeats itself every three rows. Thus, the pattern repeats itself after $3 \times 3w$ in the horizontal direction. As a consequence each aperture has an allotted cell space of $9w^2$, or $3w \times 3w$ visualized as squares surrounding the apertures. The writing strategy according to prior art used with this PD aperture arrangement was discussed above with reference to FIGS. 19 and 20.

The regular arrangement shown in FIG. 18 may be interrupted by spaces with no apertures as discussed in U.S. Pat. No. 6,768,125, e.g. to offer space for the circuitry for the internal processing of the pattern data.

Writing Strategy

In contrast to known writing strategies (cf. FIG. 19) we propose a writing strategy that minimizes data transfers on and into the APS. We refer to this strategy as "trotting" strategy, because the movement of the individual beamlets was found to be reminiscent of the movement of the diagonal legs of a horse when it is trotting.

Figure 2:
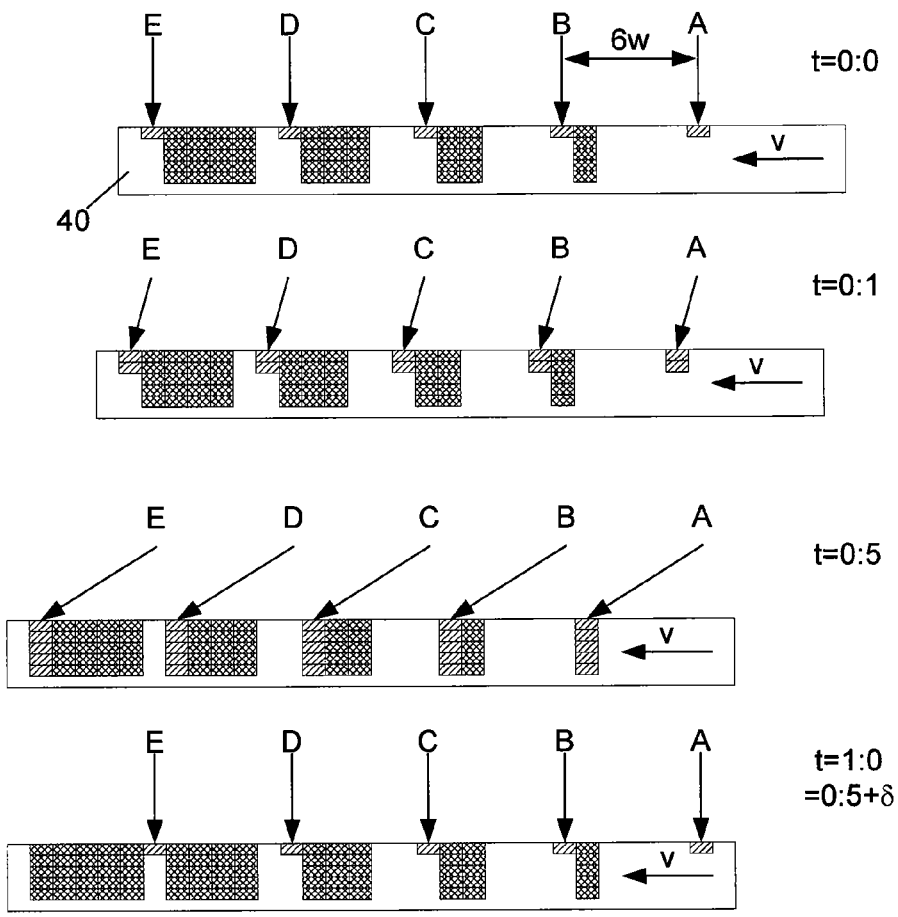
FIG. 2 illustrates the basic writing strategy of the invention with the beamlets "trotting" over the target.

FIG. 2 illustrates the principle concept of the "trotting" strategy according to the invention with a first, simplified example. A target 40, for instance a silicon wafer covered with a resist to be exposed, moves with a velocity v, while a number of beamlets (only five beamlets denoted A through E are shown for the sake of clarity) impinges on the target. Each beamlet passes the complete dose for one pixel to the resist during one pixel exposure cycle T1 lapsing between the uppermost and the lowermost frame in FIG. 2. Within the figure the cross-hatched fields denote pixels that are completely illuminated (according to the programmed pattern), while simply hatched fields indicate pixels which are currently exposed and thus are summing up the necessary dose.

The target is moved with respect to the PD device (which is assumed to remain at a fixed position beyond the top of FIG. 2), but the writing method requires that the location where each beamlet impinges on the target stays locked on the position of a pixel during a respective pixel exposure cycle in spite of that relative movement, even for a movement of the target by a distance covering multiple pixels. As a consequence, the beamlets are deflected accordingly by means of the deflection system of the imaging optics (deflectors 16 in FIG. 1).

The width of a pixel as exposed on the target is denoted w, the distance of two neighboring beamlets is N'w, wherein N' is one more than the number N of beamlets writing in parallel on one line. The factor N+1 is one simple choice to ensure that N and N' are coprime (relatively prime); any other number N' which is coprime to N could be used instead. Such a choice of N' and N will ensure the exposure of adjacent pixels through a run of N' exposure cycles. In the case of FIG. 2, N=5 and N'=N+1=6. Starting from an initial position at the beginning of an exposure cycle, shown in the initial (uppermost) frame at t=0:0, the times are consecutively denoted as t=0:1 where the continuous motion of the target has progressed by one pixel width w, t=0:2 at two pixel widths 2w (not shown), and so on. At t=0:5 (t=0:N), the movement will have proceeded to a distance of five (N) pixel widths 5w, which marks the end of the actual exposure. After that, the beamlets are directed to another set of pixels as shown in the lowermost frame of FIG. 2 to start a next pixel exposure cycle at t=1:0 (which is a time point shortly after t=0:N; in other words t=0:N+δ=1:0, where δ denotes a small time interval used to switch the beamlets).

The on/off-switching of every blanker in the PD device is controlled according to the programmed pattern, during each pixel exposure cycle. For example, if one pixel which is illuminated by its corresponding beamlet is to receive a dose of 25% of the maximum value, the blanker for that beamlet has to be opened for 25% of the pixel exposure cycle.

It should be noted that the inclination of the beamlets in FIG. 2 (and, likewise, FIG. 19) is largely exaggerated; in a true depiction of a realistic geometry of a wafer process, the angles of inclination would be quite small and seemingly inconspicuous to the human eye. Moreover, it is also possible (by using, for instance a consecutive set of electrostatic multipoles) to shift the set of beamlets laterally without affecting their orientation; in that case, the angle of inclination would not change at all. Also, the range of deflection may suitably be chosen to be symmetric around the z axis.

One typical value of the distance N'w between consecutive beamlets at the wafer is 180 μm.

Figure 3:
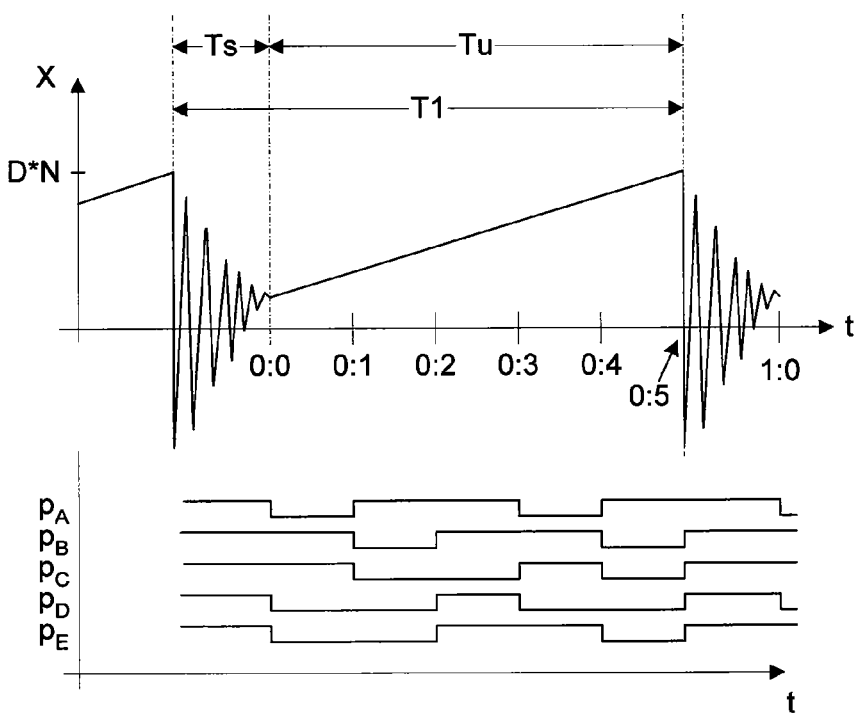
FIG. 3 shows a time diagram of the beam deflection for the "trotting" strategy.

The positioning of the beamlets on the respective pixels is controlled via suitable ion-optical devices within the imaging system, for instance an electrostatic multipole. FIG. 3 (top frame) shows the functional relation of the spatial deflection x of the beamlets as a function of the time. Not all of the time can be used to open the blanker apertures since the beamlets and multipoles need a certain settling time, denoted Ts in FIG. 3, to settle after repositioning and transient oscillations. The settling duration Ts is a small fraction of the pixel exposure cycle T1. The remaining part of the pixel exposure cycle T1, the usable time Tu=T1−Ts is used for the exposure of pixels. The time interval Tu is the pixel exposure period within which to ensure that the appropriate dose is passed to the respective pixels. In FIG. 3 also the time points of the frames of FIG. 2 are denoted. Accordingly, the time interval between consecutive frames (like 0:0 and 0:1) is dt=Tu/N (here, =Tu/5), but the last two frames of FIG. 2 are separated by the duration Ts.

The writing process as described in FIG. 2 implies no redundancy for the blanker layout. This implies the potential danger that if one blanker cell fails to work the corresponding pixel is always illuminated or not illuminated at all (depending on which way the blanker cell is defect).

Redundancy can be added simply by doubling, tripling etc. the number of blanker cells that illuminate one pixel; in general, a K-multiplication. A redundant tripling of the aperture (i.e., K=3) is exemplarily illustrated in FIG. 4. Note that the distance of those redundant apertures is an (integer) multiple of Nw. For instance, it is possible to realize K sets of (non-redundant) N' consecutive apertures, so K blocks of redundant apertures are writing within one line, and the offset between each of these K blocks is N'Nw. An alternative arrangement is to have K consecutive redundant apertures in each block, and arrange N' blocks suitably (for instance with an offset of N'w between the last aperture of one block and the first aperture of the next block); the inter-block offset is then KNw.

Figure 4:
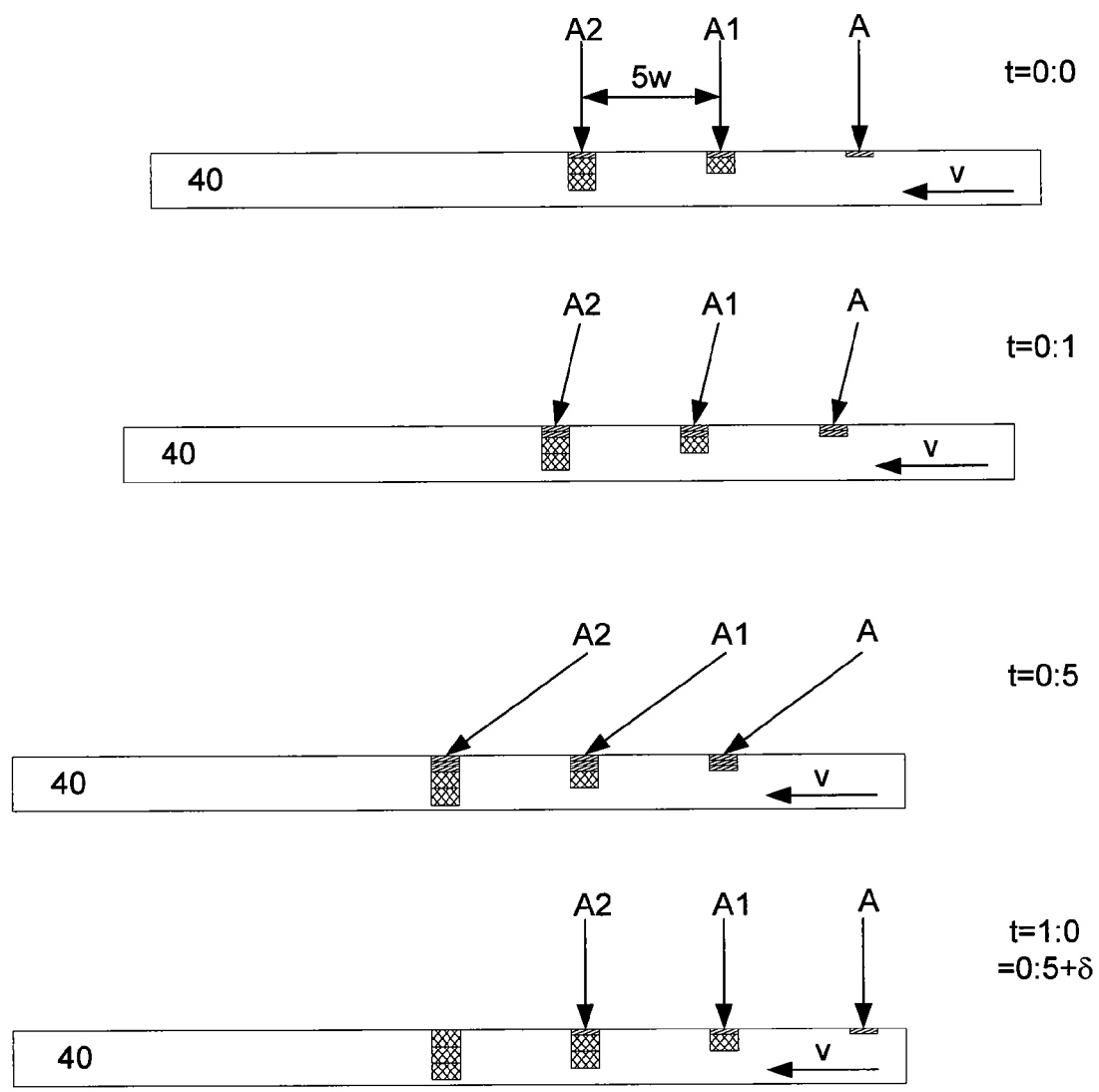
FIG. 4 illustrates redundant writing as an extension of the "trotting" strategy.
Figure 5:
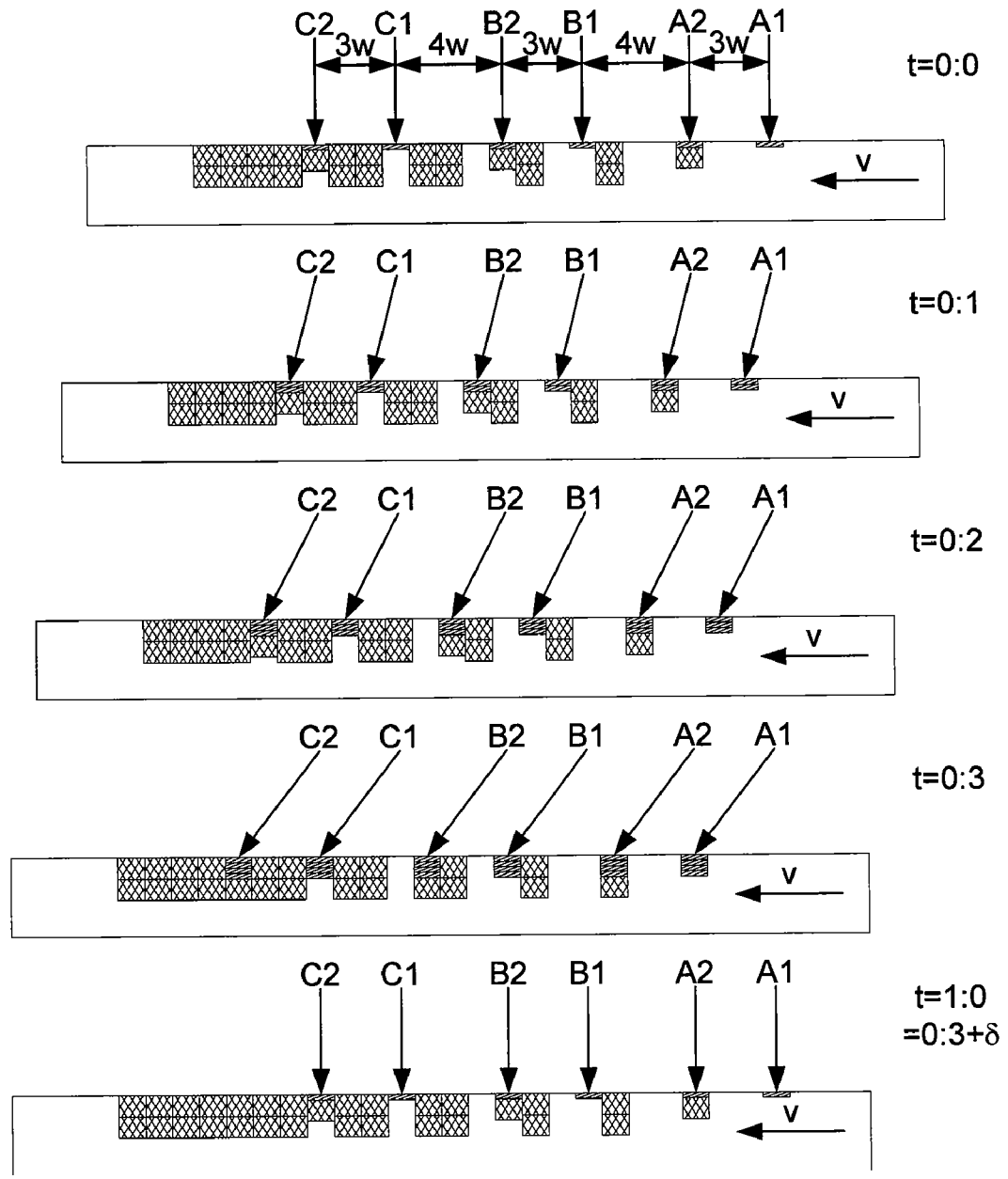
FIG. 5 illustrates the writing procedure in a combination of the concepts of FIGS. 3 and 4.

In a realistic implementation of the invention, the non-redundant and redundant writing as explained above with reference to FIGS. 2 and 4 will be combined. A simple example is illustrated in FIG. 5, with N=3, N'=4 and K=2. The beamlets are denoted A1, A2, B1, B2, C1, C2, . . . ; which is a combination of a capital letter A, B, . . . (denoting beamlets of different redundancy groups) with a digit 1 or 2 which denotes the individual redundant beamlets. Thus beamlets A1 and A2 are redundant and spaced apart by Nw=3w, while the spacing between the beamlets of subsequent redundancy groups, for instance between one A beamlet and one B beamlet, is a value (nN+N')w, which is coprime with Nw.

Figure 20:
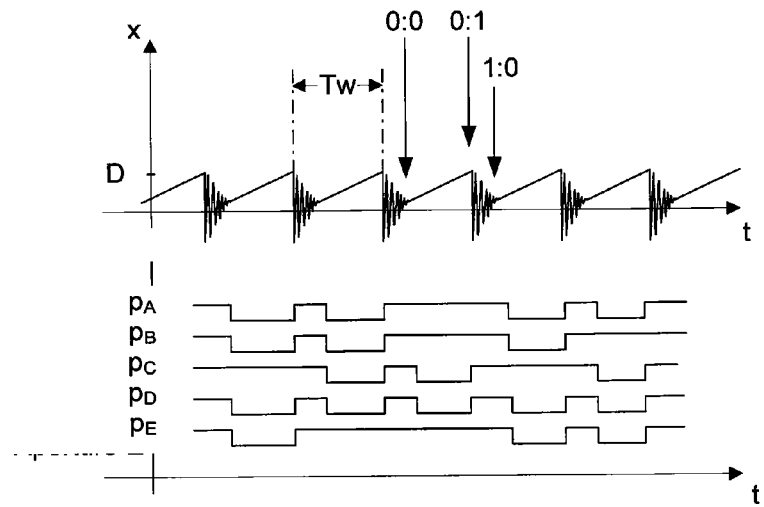

Returning to FIG. 3, the time Tu and the particle flow in the beam is chosen such that the maximum dose for one pixel, divided by a redundancy factor K', can pass through one aperture within the duration Tu. The redundancy factor used here, K', usually equals K, but may be chosen smaller if not all redundancy columns are activated. In contrast to the prior art method as shown in FIG. 20 where loading of information for each pixel is done individually and the deflection x is reset for each pixel, according to the invention the usable time Tu within each sawtooth cycle of deflection x covers multiple pixels. Furthermore a reloading of pixel information may occur multiple times within an cycle Tu according to the respective gray level of the pixel (see below 'Data Encoding'), as shown for the pixel deflection signals $p_A$ to $p_E$ in FIG. 3.

Architecture of the Blanker Plate

Figure 6:
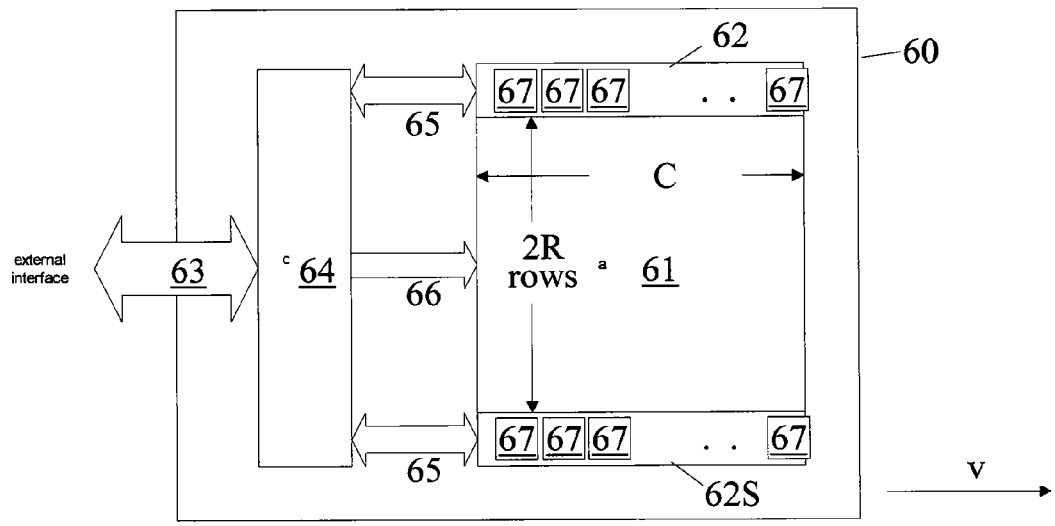
FIG. 6 is a block diagram of the circuitry of a blanking plate in a PD device for implementing the "trotting strategy"

In the following an architecture of the electronics for a blanking plate 202 is disclosed that allows to establish a writing process according to the above writing method principle. An overall block diagram of such a blanking plate 60 is depicted in FIG. 6. The blanking plate may physically be built from one single wafer die which includes logic circuits and blanking apertures, or it may be a stack or composite architecture of two or more parts. For example, a die that incorporates the logic circuitry may be contacted to a die incorporating the blanking electrodes. The blankable openings are arranged within an aperture field 61, according to 2R rows, each row having C apertures. Thus, the blanker cells can be viewed as C cell columns running perpendicular to the rows (vertical in FIG. 6; the direction of the rows is horizontal). The number C of blanker elements (apertures) in each row is preferably equal to N·N' or an integer multiple of that number. The blanker cells are addressed in a column-wise fashion using two APS memory arrays 62N, 62S (N and S standing here for 'north' and 'south', respectively), which for instance are dual ported static RAM blocks allowing a high bit density.

The memories are accessible from the external interface 63 of the blanking plate 60 in read and write mode. A control logic 64 interprets commands and data passed to it via the external interface 63 and accordingly performs addressing 65 of the memory arrays 62N,62S and provides the control signals 66 (clock, enable etc.) for the blanker cells within the aperture field 61. The north RAM data supplies the data and control signals to the upper R blanker rows and the south RAM is connected to the lower R blanker rows.

In the embodiment shown here, the memory arrays 62N, 62S are composed of a number of memory blocks 67 realized by individual memory units. Each of these blocks 67 is realized as dual ported RAM (DPRAM). Such DPRAMs are standard library elements of ASIC vendor libraries. It will be obvious that in other embodiments, the memory of the blanking plate 60 may be organized otherwise, for example in two memory banks (corresponding to arrays 62N,62S) or only one memory, or a number of memory blocks 67 may be realized by respective memory units, depending on the memory size of the memory units.

Figure 7:
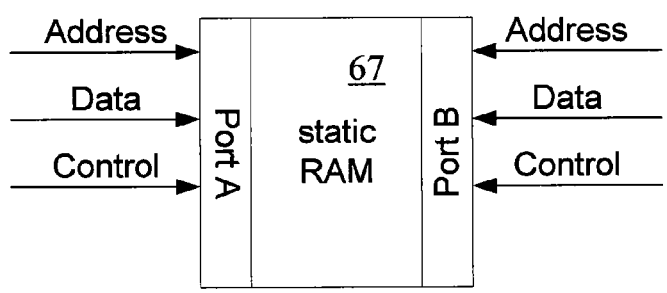
FIG. 7 is a block diagram of one RAM memory in the circuitry of FIG. 6.

Referring to FIG. 7, the RAM of each memory block 67 is built of static storage elements, which allow a very high storage density within the ASIC. The entire contents of each RAM block is addressable through two ports, labeled Port A and Port B, each of which is accessible through respective access means comprising an address bus, a data bus and additional control signals, as further explained below. The two ports allow simultaneous access of the information from two different locations. Note that the data width and address width does not necessarily need to be the same on both sides, the memory can—for example—be organized in 8 bits on Port A and as 32 bits on the Port B.

Figure 8:
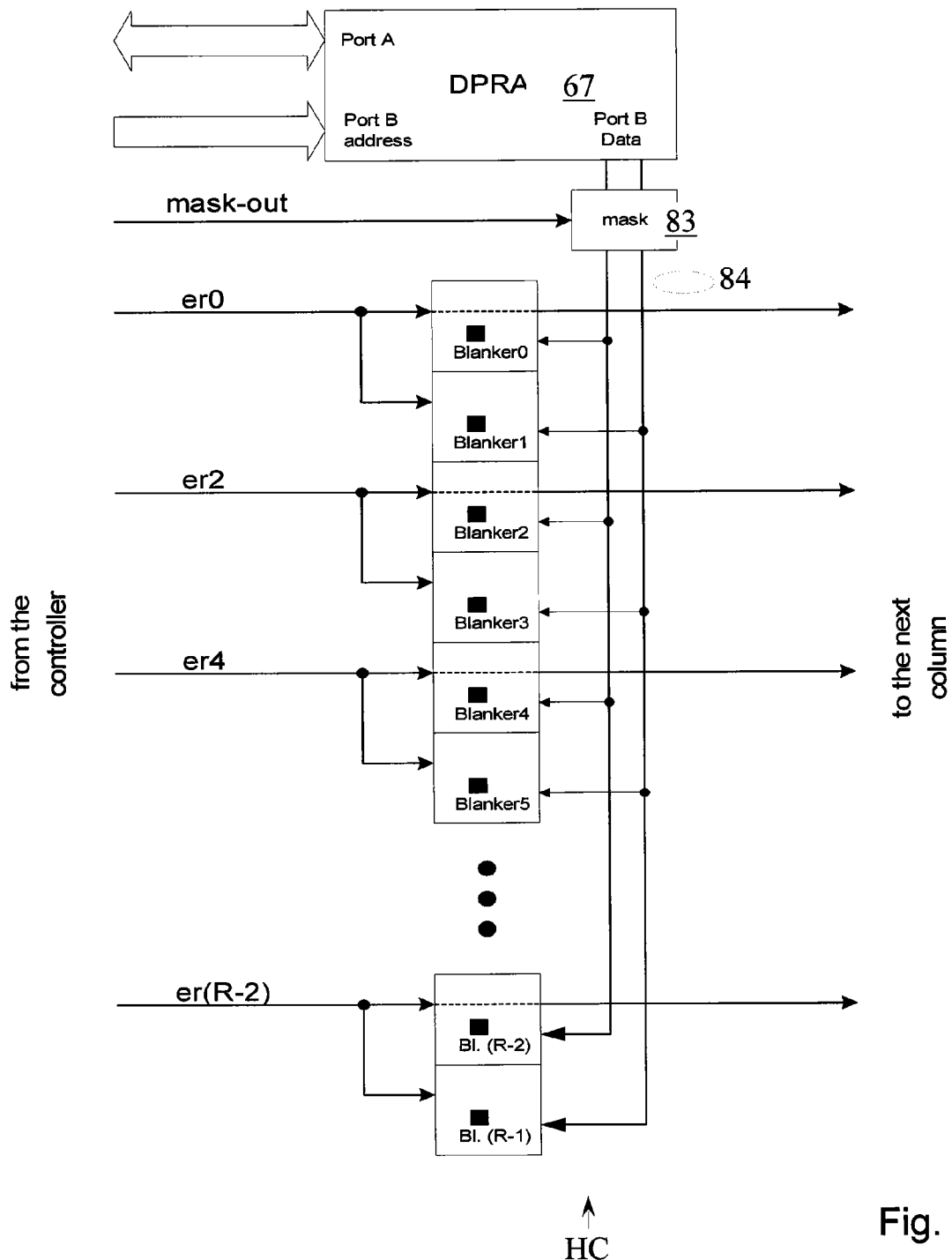
FIG. 8 is a block diagram of the data supply circuitry of a half-column of apertures in the blanking plate in the circuitry of FIG. 6.

FIG. 8 shows the design of a single half-column HC1, corresponding to the upper (north) half of one blanker column, according to the preferred embodiment of the invention. The blanker cells are denoted Blanker0, . . . , Blanker(R−1) and symbolically depicted as square areas with a small square (the aperture). The lower half of the column is realized symmetrically (mirrored at the horizontal middle axis of the aperture field 61), and further columns simply add to the left and right of the column shown. The blanker information is stored into the DPRAM 82 through Port A, and afterwards is transferred to the individual blanker cells through Port B as control signal data through the control lines 84. Every blanker cell is provided with a 1-bit memory (e.g., a flip flop) to store the current data provided from the DPRAM.

In the layout of FIG. 8 the width bw of the control line data is 2 bits (bw=2), but it can have any other number as well. It is useful to choose the number R in a way that it is an integer multiple of bw. Higher values of bw allow a shorter reloading time of a complete column. The individual blanker cells are enabled to store the information provided from the DPRAM by means of enable-row signals er0, er2, . . . er(R−2) at the correct point of time, each enable-row signal activating a group of bw cells. Only one enable-row signal is active at a time, so the data on the control line 84 is loaded into the one correct blanker cell group; after that, the next blanker cell group is loaded, and so on. For example, if R=128 and bw=8, a column can be reloaded within 128/8=16 clock cycles. Within a 70 MHz design this relates to a time of 230 ns.

Preferably, sufficient memory is provided to allow an "interleaved" reloading of the blanker cells: The memory of the DPRAM is divided into two address areas A0 and A1 so it is possible to reload one address area A0 via Port A and at the same time load the data stored in the other address area A1 into the blanker cells. In the next pixel exposure cycle the banks are switched, A1 is reloaded via Port A while A0 is loaded into the blanker cells.

For efficient writing algorithms as well as for testing purposes it is useful to provide a static data setting on the control line 84 that allows switching all blanker cells into the blanking mode (switched-off apertures) at the same time. This is done by means of a "mask" block 83, activated by a mask-out signal. If the mask-out signal is set, the data of all blanker cells in the half-column shown will be set to 1, whereas in the normal working mode the mask block 83 is transparent to the data coming from Port B.

Furthermore, it is possible to optionally realize a global blanker-enable signal, which allows switching all apertures of the aperture field simultaneously, for instance as a signal activating all mask-out and enable-row signals of all (half-) columns.

The present layout also allows implementation of "gray levels", i.e., exposure doses between no exposure (minimum dose, 0%) and full exposure (maximum dose at a pixel, 100%;

see also US 2005/0242303 A1). The gray levels are realized as discrete steps from 0 to g−1, with g being an integer representing the 100% level. The number g of gray levels that can be realized may be realized in the present layout as follows.

Figure 9:
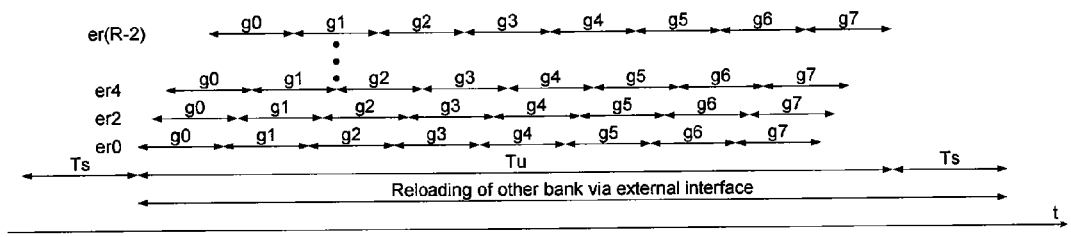
FIG. 9 shows a time diagram of the controller operation and loading sequence of pattern data.

FIG. 9 shows a timing diagram for the controller operation with 8 gray levels (g=8, three bits), time shown proceeding along the horizontal axis. Conceptually, the time Tu is divided into g time slots, during some of which the pixel is activated according to the desired gray level. For example, with a gray level 5 out of 8, there are eight time slots in each Tu and five of them are set to switched-on. If the dose applied to one pixel within the time Tu is digitized into g gray levels, the blanking cells are reloaded g times within Tu. The blanker cell groups are labeled consecutively by enable-row designators, the gray level components are labeled g0 through g7. The complete loading cycle of the blanker cells is done within one "usable" cycle time Tu. The data is loaded into the blanker cells at g consecutive times (corresponding to time slots) and activated at the start of the respective time slots as shown in FIG. 9; simultaneously, the next set of data for the following exposure cycle is loaded. Note that the loading times are staggered between different blanker cell groups as denoted in FIG. 9. In the final part of Tu, each blanker cell group is switched off after the last gray level slot g7 expires; this is conveniently achieved by means of the mask block 83 controlled through the mask-out signal as shown in FIG. 8. The switched-off state continues until the first gray level slot g0 of the next exposure cycle is loaded and activated. The timing diagram shown provides an optimal dose preparation by the APS.

In FIG. 3, below the depiction of the time-dependent deflection x, examples for data streams of five different apertures during the time Tu are illustrated. These data streams can be generated directly on the APS from the gray level data. This method is explained in more detail within the following section.

Data Encoding

In actual applications, the patterns to be generated comprise gray levels, realizing g gray levels ranging from 0 to 100% of a full exposure of a pixel. Since for g gray levels g bits will have to be stored within the SRAM, this incurs an overhead within the data. To lower the data rate via the external interface it is possible to send only the gray level G (G=ld(g) bits) to the APS and to provide a data expansion from a gray level (a G-bit number) to the g aperture bits inside the APS. This may be done before the data is stored within the DPRAM or when reading the data from the DPRAM and passing it to the blanker cells.

In the case that the data are first expanded and then stored in the DPRAM, each gray level has to be converted into a vector of bits. Successive vectors (i.e. vectors of neighboring apertures) are arranged into a matrix. After collecting a certain number, for convenience the same number as gray levels are used to obtain a g×g matrix, the matrix has to be transposed (changing rows and columns) and written to the DPRAM.

Expansion after storing in the DPRAMs ("late extraction"), on the other hand, saves memory area, and the controller does not need to change the data format from the data provided via the external interface.

Figure 10:
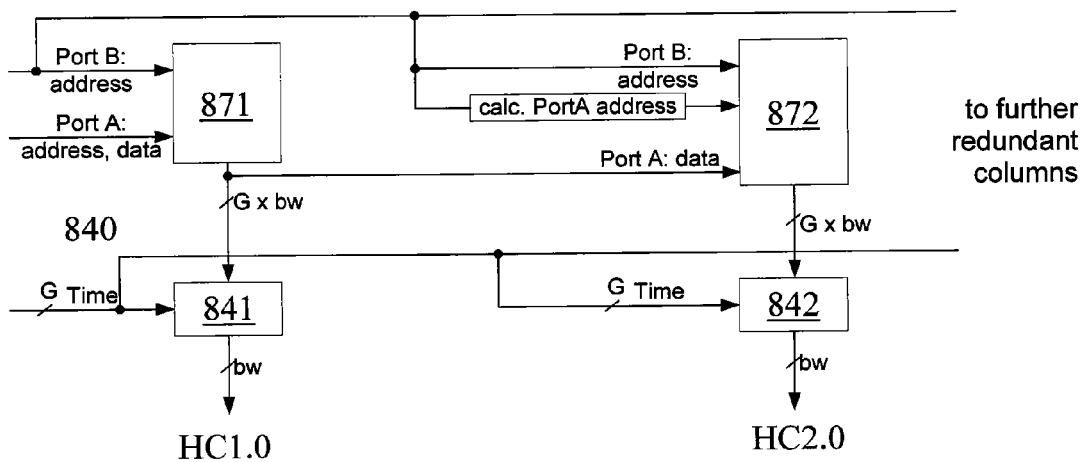
FIG. 10 depicts a modification of the layout of FIG. 8 for redundant column information.

FIG. 10 depicts one basic logic layout realizing late extraction with redundant columns. Two corresponding half-columns are shown in FIG. 10 and denoted HC1.0 and HC2.0, respectively. (For the sake of clarity, only two columns which are redundant as explained with reference to FIG. 4 are shown in FIG. 10; the second column HC2.0 is representative for all further redundant columns. The remaining columns, in particular columns providing writing of further non-redundant pixels, are suppressed.) An additional time signal 840 is used, which is common to all columns and is updated after each gray-level slot. The DPRAM logic 871 for the first column HC1.0 derives, from the data received, the full data of width G·bw for the set of redundant half-columns. An extractor 841 expands the gray level information and extracts the single bit data (bw bits) for the first half-column 1.0 based on the time signal as further explained below. The full data of width G·bw are passed to the DPRAM of the next redundant column HC2.0. The DPRAM logic 872 of the half-column HC2.0 can therefore use the copied data in the next illumination cycle; only the address data are supplied from the control logic. The procedure is repeated in an analogous manner for further redundant half-columns (not shown) as with column HC2.0.

Note that since the columns HC1.0, HC2.0 are designed for redundant writing, they will necessarily operate with identical gray-level data; the expansion of gray level information into individual on/off information is done in the respective extractors 841, 842. In the layout shown in FIG. 10, the DPRAM of column 1.0 also provides a buffering functions for the data input from the control logic.

For the data expansion different algorithms can be used, as for example algorithms to generate pseudorandom sequences, distributing the "on" time of the redundant apertures equally over Tu in a quasi-stochastic manner.

The time information 840 is used by the extractors 841, 842 for generating an exposure bit in accordance with the desired gray level and the actual time to obtain the bit sequence appropriate for the gray level. At every time step corresponding to a gray-level slot the extractor generates bw bits employing or emulating, for each of the bw rows, an extraction function f which takes the time information 840 (G bits) and the gray level (G bits) associated with the respective row and returns a bit signal (boolean function); in symbolical form: f=f(Time, Graylevel). The result of this function is then passed as a control signal to the corresponding aperture. In a simple embodiment the time information 840 is generated by a linear counter (not shown) which is incremented at each time step, and the extraction function f is a comparison f=compare (Time<Graylevel)

In a preferred embodiment the time signal 840 is the output of a G-bit random number generator (e.g. linear feedback shift register LFSR) that generates the numbers 0 to g for the calculation of every bit g of the exposure control signal stream in a random order, but each number once for a set of g gray-level slots. Then, the function f can again be a comparison f=compare(Time<Graylevel), which directly relates to the control signal passed to the apertures. The use of such a random generator decorrelates the bit stream for an aperture in time.

A further parameter can be incorporated in the comparison to decorrelate the data streams between individual pixels. For instance, every pixel obtains beside its gray level information also an individual number acting as a "sequence-key" that determines the actual bit sequence generated for the specified gray level. The sequence-key is kept unchanged during the whole exposure cycle. The sequence-key is used as an offset value added or subtracted (modulo g) to the value provided by random number generator before the comparison with the gray level is performed; i.e., symbolically, f=compare ([(Time−Sequencekey) (mod g)]<Graylevel).

Redundant Blanking Plate Configuration

Figure 11:
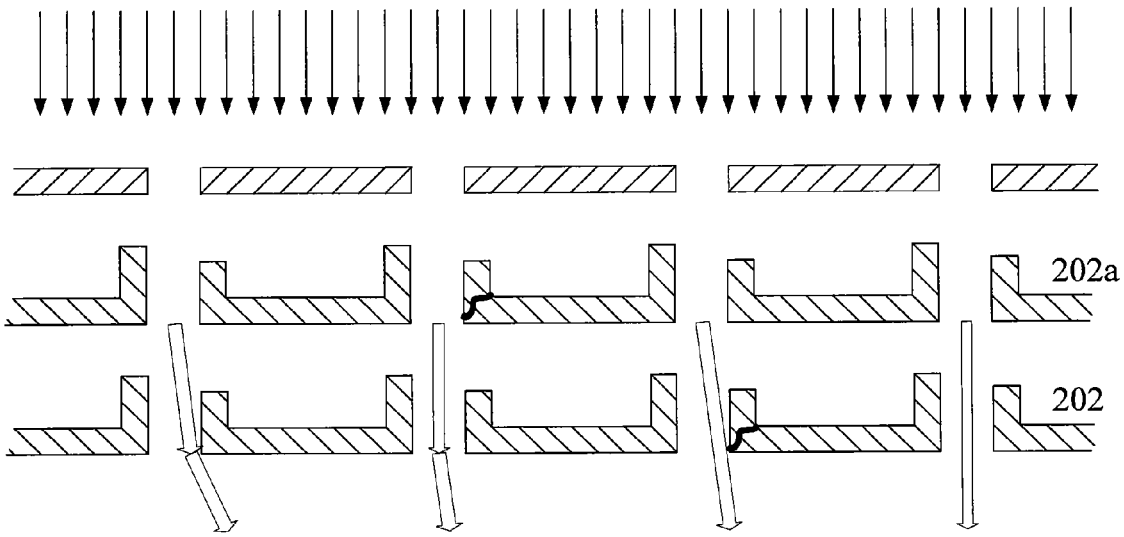
FIG. 11 shows a PD device (longitudinal sectional detail) with a redundant configuration of two blanker plate devices working in parallel.

One possible (and presumably the most likely) type of failure in an APS system as shown here is a failure of a blanking cell due to mechanical or electrical damage, such that the corresponding beamlet cannot be blanked (always open error). By providing a stack of two blanking aperture plates positioned one on top of the other and electronically running in parallel, the probability of always open errors will be significantly reduced. This redundant configuration with two blanker plate devices 202a, 202b working in parallel is illustrated in FIG. 11. The two outer apertures shown in FIG. 11 are intact, whereas the two inner apertures have defects in the first or second blanker plate, respectively. Due to the redundant stacking of blanker plates, the proper operation of the two apertures is ensured.

Aperture Arrangement

Figure 12:
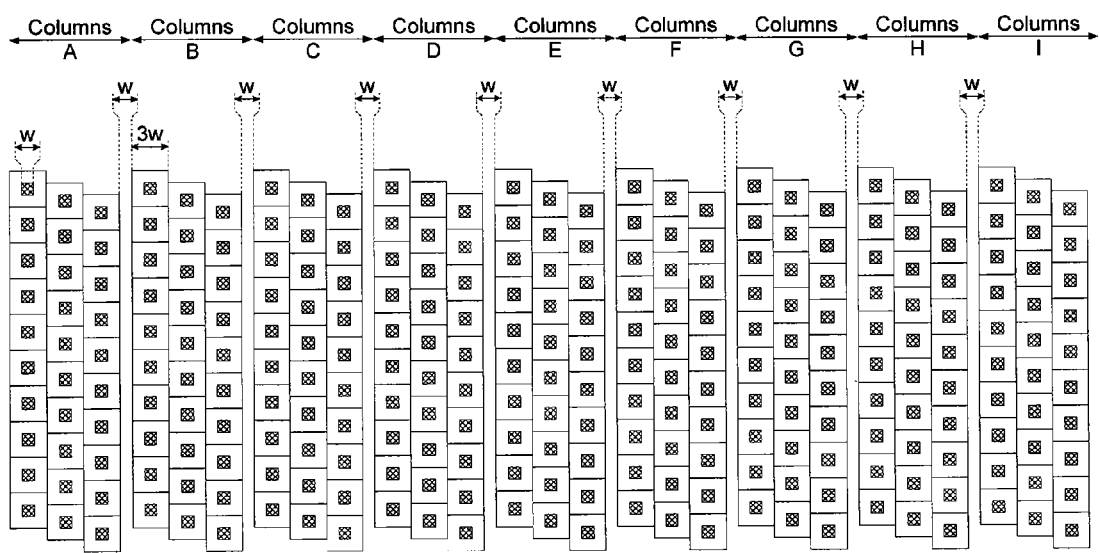
FIG. 12 shows a plan view with the geometric layout of an aperture arrangement designed to incorporate the "trotting" strategy.

FIG. 12 shows an example of the arrangement of apertures according to the invention. This drawing is to be seen in comparison to the prior-art arrangement of FIG. 18 discussed above. In the plan view of FIG. 12 the orientation is the same as in FIG. 18, and the directions of orientation coincide with those of FIGS. 6 and 8; the apertures are represented as cross-hatched squares. Like in FIG. 18, each apertures has an allotted cell space of 3w×3w. In contrast to prior art, an additional space is inserted between each block of three apertures in order to realize a spacing of N'w (here: 10w) which is coprime with the basic spacing within a row (here: 3×3w).

Figure 13:
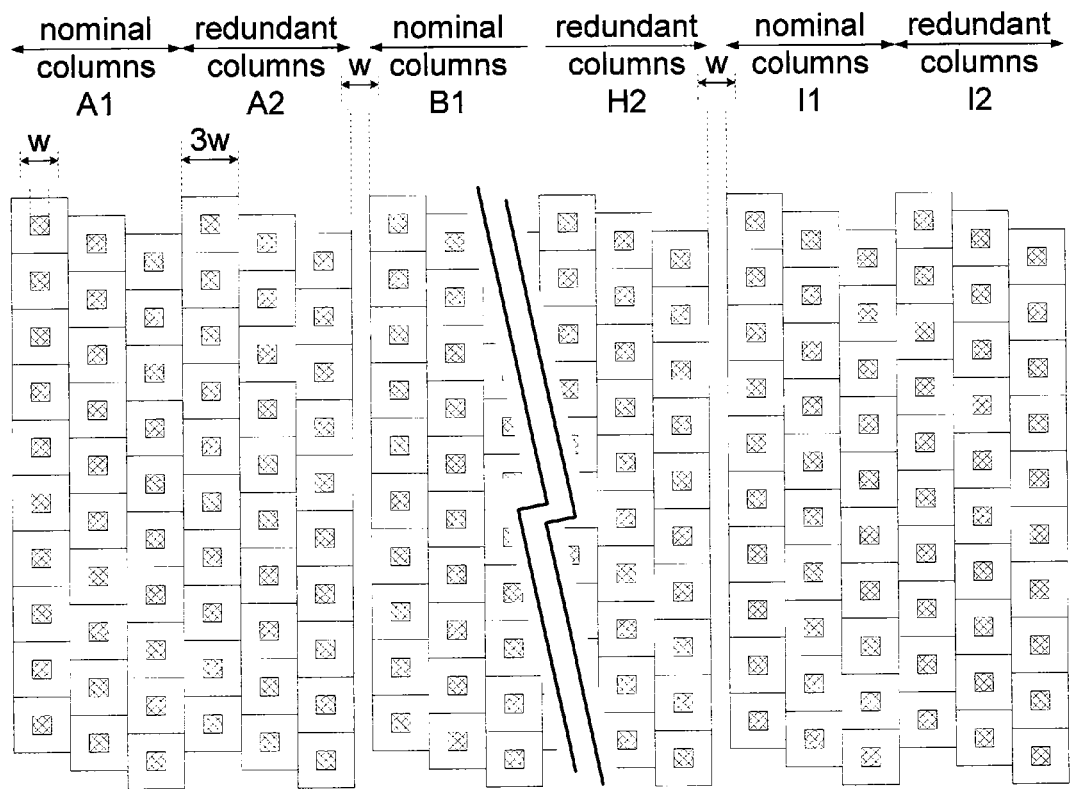
FIG. 13 shows a variant of the layout of FIG. 12 with a redundancy of two.
Figure 14:
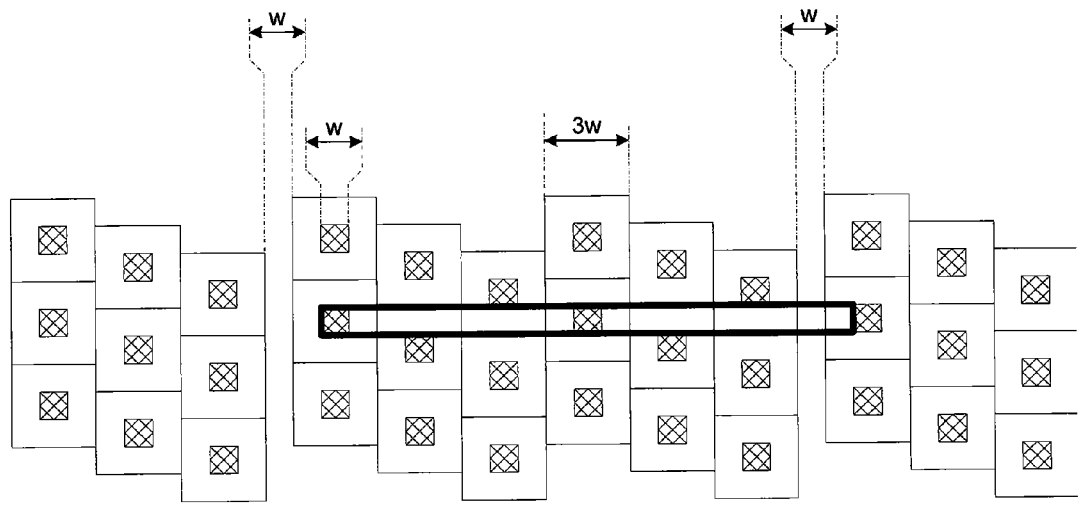
FIG. 14 shows an enlarged detail of FIG. 13, with one elementary cell shown highlighted.

FIG. 13 shows a variant of the arrangement including a redundancy of two (K=2). Each block of apertures is now doubled. The enlarged detail of FIG. 14 shows the elementary cell of this arrangement. As can be seen, the spacing of apertures within the redundancy group of apertures is an integer multiple of the basic spacing (namely, in this case 9w), whereas the spacing to the first aperture of the next block comprises an additional offset; here, the offset is 1w, so N'w= (1+9)w. Thus, within this cell the apertures have a spacing to provide the redundancy and the APS can be constructed by a concatenation of multiple instances of this elementary cell.

Marker Reading

The proposed architecture can also be used for reading of markers 41, 42 on the target 40. Such markers consist of a material that reflects a high percentage of the beam current or produces secondary radiation upon irradiation with the beam so these reflections can be measured by means of a detector 44 located laterally to the beam. Preferable types of secondary radiation may be, for instance, secondary electrons or Auger electron radiation. In particular, Auger radiation has the advantage that it provides a characteristic electron radiation at a specific energy with very low line width, so it is possible to tune the detector 44 accordingly.

Figure 15:
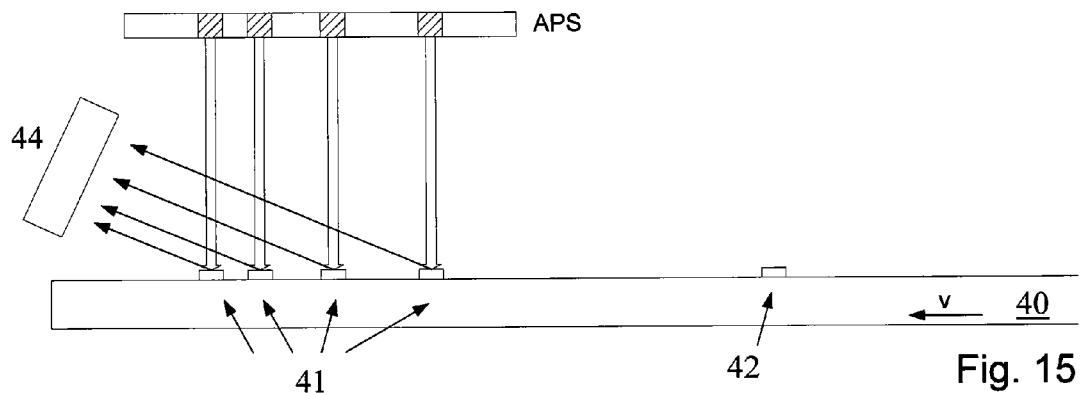
FIGS. 15, 15a and 16 illustrate the use of markers on the target for target positioning, with FIG. 15 showing a first stage of initial positioning and FIG. 16 a second stage of fine positioning.
Figure 16:
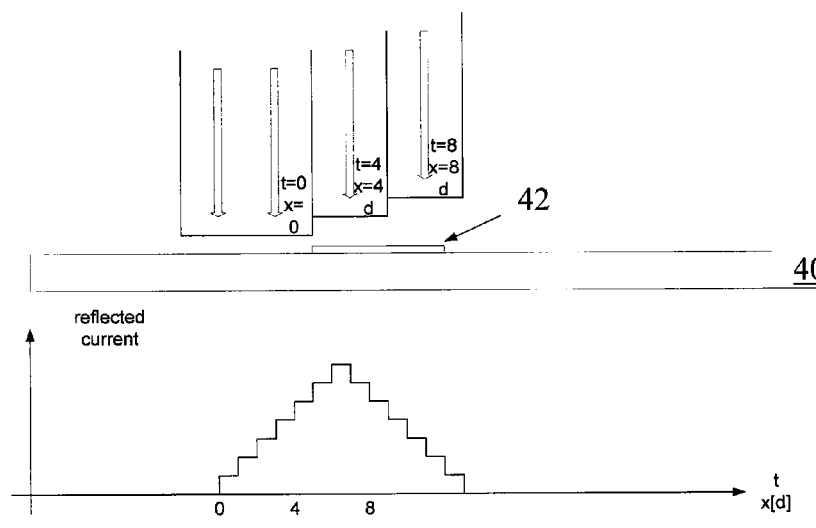

For instance referring to FIGS. 15 and 16, a two-stage marker reading may be realized in order to allow a coarse and a fine synchronization of the positioning between table and beam position. In the first stage (FIG. 15), for the purpose of finding the coarse position on the resist, a marker coding with a high autocorrelation peak may be used, such as lines arranged as bar codes or with a prime-number marker spacing. The PD device is then configured to illuminate the marker pattern 41 on the resist, and in the case the pattern thus programmed matches the pattern on the target, a correlation peak is observable in the secondary current. Optimum performance will be obtained when all markers have the width w, viz. equal to the beamlet width. The correlation peak of the coarse marker pattern 41 is used to determine the position of a fine marker 42, which is located with a distance to the coarse markers 41 to allow real-time processing of the detector data, with an accuracy±w.

In the second stage (FIG. 16), the fine marker 42 may be used to increase the resolution of the marker finding procedure. Since the position of the fine marker is known to be in a field that is 2w wide, the PD device and the deflectors are configured to step through this field with a step width d according to the needed resolution while the relative movement of the target is preferably maintained to proceed at the same continuous motion and speed as during the pixel exposure process discussed above. A first beamlet 1 is positioned at the beginning of the 2w interval (x=0), a second beamlet 2 at x=d, and so on until the end of the interval is reached. Thus, the beamlets overlap and cause an intensity distribution that increases in steps to a maximum and then decreases again as shown in FIG. 16. Whenever the highest reflection current is measured, the maximum congruence between beamlets and marker has been found. This process can take place independently from any movement of the resist.

The detector 44 used in the position synchronization should have a sufficiently high time resolution which corresponds to the spatial resolution (i.e., w or d) required divided by the velocity v of the relative movement of the target. Therefore, the sampling rate of the detector 44 is suitably at least smaller than 1/Tu. In order to increase the signal integration time, the time during which the beam is locked on the substrate may be chosen larger than the time of exposing one pixel (e.g. 10 Tu) when it is passing the region where the markers are located, without changing or reducing the scanning speed of the target. In other words, the distance of advance used in the position synchronization may be a multiple of the distance which is covered by the relative movement of the target during a typical pixel exposure period Tu during a subsequent (or foregoing) exposure process. This approach may appear to cause that some pixels in the area immediately following the marker region along the scanning direction cannot be completely exposed, but in fact this will be avoided since the markers will be sufficiently separated spatially from the surrounding lithography pattern (or microstructure pattern) to be formed.

Figure 15A:
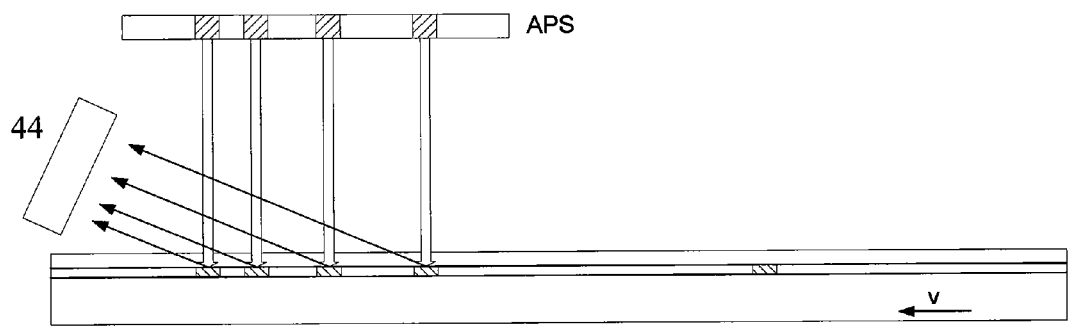

FIG. 15a illustrates the use of a variant of the markers, namely, buried markers 411. The markers 411 may have been produced in the course of preceding processing steps and covered by a coating material generated in an additional processing step. The structuring of the markers 411 may also have been achieved in situ by appropriate methods such as deep ion-irradiation where the ions pass a coating layer and substantially only affect a buried layer (which would be the markers). One suitable realization of the markers is metallic layers, preferably in a multi-layer structure, which are located beneath but close to the target surface. FIG. 15a shows a first stage as explained above referring to FIG. 15, but it will be clear that the buried markers 411 may be used for fine resolution positioning as shown in FIG. 16 as well.

Summarizing, the invention enables to realize designs using fully synchronous design methods with only one clock. Although the apertures will not switch simultaneously (which is an advantage for the power consumption characteristics within the chip), the time an individual aperture is opened or closed is extremely accurate as it only depends on the accuracy of the clock (which is normally within the range of some ppm). Further advantages of the present blanking plate layout are:

Reduced number of flip flops that is strongly reduced over the earlier PML2 concepts.
Number of flip flop switching lower by a factor of in the order of several thousands.
Power consumption is reduced drastically (in the same mode of operation).
Switching of the flip flops is distributed over a larger time.
Switching of the apertures is distributed over a larger time.
Design is fully synchronous and uses only one clock.
Writing strategy allows corrections of the optical system within the data stream.

While preferred embodiments of the invention have been shown and described herein, it will be understood that such embodiments are provided by way of example only. Numerous variations, changes and substitutions will occur to those skilled in the art without departing from the spirit of the invention. Accordingly, it is intended that the appended claims cover all such variations as fall within the spirit and scope of the invention.

I claim:

1. A method to position a target using a beam of energetic electrically charged particles, comprising:
providing a pattern definition means having a plurality of apertures transparent to said particles,
illuminating said pattern definition means by means of said beam, which traverses the pattern definition means through said apertures thus forming a patterned beam (pb) consisting of a corresponding plurality of beamlets,
forming said patterned beam into an image on the location of the target, said image comprising the images of at least part of the plurality of apertures, said images of apertures having a first width (w), and at least part of the beam impinging on markers provided on the target which then produce secondary radiation,
moving the target relative to the pattern definition means along a path within an image plane in which the images of apertures are formed, wherein the relative movement of the target covers a distance of advance greater than the first width as measured on the target,
measuring said secondary radiation by a detection system with a suitably high sampling rate, and
adjusting the position of the target in a manner that the secondary radiation as measured obtains an extremal (maximum or minimum) value.

2. The method of claim 1, wherein the substrate stage moves the target at a continuous speed equaling a speed at which the target is moving during a subsequent exposure process.

3. The method of claim 1, wherein the markers comprise structures which are part of a multilayer structure, said structures having been formed on the target in at least one foregoing process step.

4. The method of claim 1, wherein the markers comprise components adapted to produce secondary radiation comprising characteristic Auger electron radiation, and the detection system employs an energy selective detector adapted to detect said Auger radiation.

5. The method of claim 1, wherein the markers comprise components having a characteristic backscattering yield.

6. The method of claim 1, comprising a subsequent particle-beam exposure process performed on the target in which the same pattern definition means is used and the target moves relative to the pattern definition means in a corresponding manner.

7. The method of claim 1, wherein said distance of advance is a multiple of a distance which is covered by the relative movement of the target during a typical pixel exposure period during a subsequent exposure process.

* * * * *